United States Patent
Sano et al.

(10) Patent No.: US 12,370,606 B2
(45) Date of Patent: Jul. 29, 2025

(54) CUTTING TOOL

(71) Applicant: Sumitomo Electric Hardmetal Corp., Itami (JP)

(72) Inventors: Kenta Sano, Itami (JP); Satoru Kukino, Itami (JP); Michiko Matsukawa, Itami (JP); Nozomi Tsukihara, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 613 days.

(21) Appl. No.: 17/789,788

(22) PCT Filed: Dec. 9, 2020

(86) PCT No.: PCT/JP2020/045797
§ 371 (c)(1),
(2) Date: Jun. 29, 2022

(87) PCT Pub. No.: WO2021/140818
PCT Pub. Date: Jul. 15, 2021

(65) Prior Publication Data
US 2023/0050739 A1    Feb. 16, 2023

(30) Foreign Application Priority Data
Jan. 8, 2020 (JP) .................. 2020-001525

(51) Int. Cl.
*B32B 9/00* (2006.01)
*B23B 27/14* (2006.01)
(Continued)

(52) U.S. Cl.
CPC ............ *B23B 27/148* (2013.01); *C23C 14/02* (2013.01); *C23C 14/0641* (2013.01);
(Continued)

(58) Field of Classification Search
CPC ................. B32B 27/148; C23C 14/02; C23C 14/0641; C23C 14/0652; C23C 14/325
(Continued)

(56) References Cited

U.S. PATENT DOCUMENTS

| 2018/0099335 A1 | 4/2018 | Takeshita et al. |
| 2020/0061718 A1 | 2/2020 | Paseuth et al. |
| 2021/0162510 A1 | 6/2021 | Fuwa |

FOREIGN PATENT DOCUMENTS

| CN | 110352107 A | 10/2019 | |
| DE | 60210399 T2 * | 8/2006 | ......... C23C 14/0676 |

(Continued)

OTHER PUBLICATIONS

Yu X. Xu et al., "Effect of the modulation ratio on the interface structure of TiAlN/TiN and TiAlN/ZIN multilayers: First-principles and experimental investigations", Acta Materialia, vol. 130, Mar. 19, 2017, pp. 281-288, total 8 pages.
(Continued)

*Primary Examiner* — Daniel H Miller
(74) *Attorney, Agent, or Firm* — XSENSUS LLP (57) ABSTRACT

A cutting tool includes a substrate; and a coating film, wherein the coating film includes a multilayer structure layer having first unit layer(s) and second unit layer(s), the first unit layer(s) and the second unit layer(s) are alternately layered, under a condition X-ray diffraction intensities of different planes in the multilayer structure layer are respectively represented by $I_{(200)}$, $I_{(111)}$, and $I_{(220)}$, the following formula $0.6 \leq I_{(200)}/\{I_{(200)}+I_{(111)}+I_{(220)}\}$, the first unit layer(s) has a NaCl-like structure in which an interplanar spacing $d_{1c}$ in a c-axis direction is larger than an interplanar spacing $d_{1a}$ in an a-axis direction, the second unit layer(s) has a NaCl-like structure in which an interplanar spacing $d_{2c}$ in the c-axis direction is smaller than an interplanar spacing $d_{2a}$ in the a-axis direction, and the following formulas are satisfied as well $1 \leq d_{1a}/d_{2a} \leq 1.02$, $1.01 \leq d_{1c}/d_{2c} \leq 1.05$, and $d_{1a}/d_{2a} < d_{1c}/d_{2c}$.

19 Claims, 4 Drawing Sheets

(51) Int. Cl.
  *C23C 14/02* (2006.01)
  *C23C 14/06* (2006.01)
  *C23C 14/32* (2006.01)

(52) U.S. Cl.
  CPC ........ *C23C 14/0652* (2013.01); *C23C 14/325* (2013.01); *B23B 2228/105* (2013.01)

(58) Field of Classification Search
  USPC .......................................................... 428/689
  See application file for complete search history.

(56) References Cited

FOREIGN PATENT DOCUMENTS

| EP | 709483 A2 | 5/1996 |
|---|---|---|
| EP | 3 342 512 A1 | 7/2018 |
| JP | 8-127862 A | 5/1996 |
| JP | 8-127863 A | 5/1996 |
| JP | 2008-264971 A | 11/2008 |
| JP | 2010-120100 A | 6/2010 |
| JP | 2012-97303 A | 5/2012 |
| JP | 2018-202533 A | 12/2018 |
| WO | 2017/169498 A1 | 10/2017 |
| WO | 2019/230166 A1 | 12/2019 |

OTHER PUBLICATIONS

Xu et al., "Effect of the modulation ratio on the interface structure of TiAlN/TiN and TiAlN/ZlN multilayers: First-principles and experimental investigations", Acta Materialia, May 15, 2017, vol. 130, pp. 281-288.

Schlögl et al., "Influence of CrN and AlN layer thicknesses on structure and mechanical properties of CrN/AlN superlattices" Thin Solid Films, Oct. 31, 2013, vol. 545, pp. 375-379.

\* cited by examiner

CUTTING TOOL

CROSS-REFERENCE TO RELATED APPLICATIONS

The present application is based on PCT/JP2020/045797 filed on Dec. 9, 2020, which claims priority to JP 2020-001525 filed on Jan. 8, 2020, the entire contents of each are incorporated herein by reference.

TECHNICAL FIELD

The present disclosure relates to a cutting tool. The present application claims a priority based on Japanese Patent Application No. 2020-001525 filed on Jan. 8, 2020, the entire content of which is incorporated herein by reference.

BACKGROUND ART

In recent years, a cutting tool exhibiting an excellent tool life under various cutting conditions has been required. As required performance of a tool material, it is more important to improve wear resistance and breakage resistance, which directly affect the tool life. Therefore, in order to improve these characteristics, a cutting tool has been used in which two types of layers having different properties are alternately layered on a surface of a substrate.

CITATION LIST

Patent Literature

PTL 1: Japanese Patent Laying-Open No. H08-127862
PTL 2: Japanese Patent Laying-Open No. 2018-202533

SUMMARY OF INVENTION

A cutting tool according to the present disclosure includes: a substrate; and a coating film provided on the substrate, wherein
  the coating film includes a multilayer structure layer having one or more first unit layers and one or more second unit layers,
  in the multilayer structure layer, the one or more first unit layers and the one or more second unit layers are alternately layered,
  when X-ray diffraction intensities of a (200) plane, a (111) plane, and a (220) plane in the multilayer structure layer are respectively represented by $I_{(200)}$, $I_{(111)}$, and $I_{(220)}$, the following formula 1 is satisfied:

$$0.6 \leq I_{(200)}/\{I_{(200)}+I_{(111)}+I_{(220)}\} \quad \text{Formula 1,}$$

each of the one or more first unit layers has a NaCl-like structure in which an interplanar spacing $d_{1c}$ in a c-axis direction is larger than an interplanar spacing $d_{1a}$ in an a-axis direction,
  each of the one or more second unit layers has a NaCl-like structure in which an interplanar spacing $d_{2c}$ in the c-axis direction is smaller than an interplanar spacing $d_{2a}$ in the a-axis direction,
  the following formulas 2, 3 and 4 are satisfied:

$$1 \leq d_{1c}/d_{2a} \leq 1.02 \quad \text{Formula 2}$$

$$1.01 \leq d_{1c}/d_{2c} \leq 1.05 \quad \text{Formula 3, and}$$

$$d_{1a}/d_{2a} < d_{1c}/d_{2c} \quad \text{Formula 4,}$$

each of the interplanar spacings in the a-axis direction is a lattice spacing in a direction perpendicular to a layering direction of the one or more first unit layers and the one or more second unit layers, and
  each of the interplanar spacings in the c-axis direction is a lattice spacing in a direction parallel to the layering direction of the one or more first unit layers and the one or more second unit layers.

DETAILED DESCRIPTION

Problem to be Solved by the Present Disclosure

Figure 5:
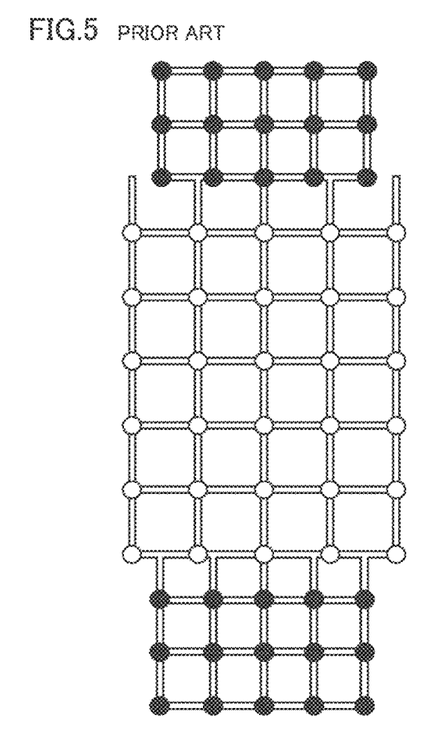
FIG. 5 is a schematic cross sectional view illustrating a state of an interface between two layers in a conventional multilayer structure layer.

In the case where two types of layers are simply alternately layered on a surface of a substrate, when crystal lattices in the respective layers are different, the crystal lattices are mismatched at an interface between the two layers (see FIG. 5). Therefore, adhesion strength at the interface between the two layers tends to be decreased, and there is room for improvement.

Various proposals have been made for improvement with regard to the above-described crystal lattice mismatch. For example, Japanese Patent Laying-Open No. H08-127862 (PTL 1) discloses a layered material including a layered portion and an intermediate layer that is a layer disposed on the substrate side of the layered portion, the layered portion consisting of at least two compound layers that are each mainly composed of one or more elements (first elements) selected from a group IVa element, a group Va element, a group VIa element in a periodic table, Al, Si, and B and one or more elements (second elements) selected from B, C, N, and O, and that have different compositions, the layered portion having crystal lattices continuous for one or more periods between the layers, the intermediate layer being composed of one or more elements (third elements) selected from the group IVa element, the group Va element, and the group VIa element in the periodic table, and one or more elements (fourth elements) selected from C, N, and O, wherein the intermediate layer and at least a layer of the layered portion closest to the substrate side have continuous lattices.

Further, Japanese Patent Laying-Open No. 2018-202533 (PTL 2) discloses a surface-coated cutting tool including: a substrate; and a coating film formed on the substrate, wherein the coating film includes a layer structure in which A, B and C layers are repeatedly layered in this order, wherein the A, B, and C layers have different compositions, each of the A, B, and C layers is a nitride of at least two elements selected from a group consisting of a group 4 element, a group 5 element, a group 6 element in a periodic table, Al, Si, B, and Y, and a lattice constant $L_A$ of the A layer, a lattice constant $L_B$ of the B layer, and a lattice constant $L_C$ of the C layer satisfy a relation of a predetermined formula, a difference in lattice constant between the A layer and the C layer is more than or equal to 0.1100 Å and less than or equal to 0.1500 Å, and each of the A, B, and C layers has a cubic type crystal structure.

In each of the layered material described in PTL 1 and the coating film described in PTL 2, the crystal lattice mismatch at the interface between the two layers is eliminated; however, large compressive residual stress is caused, so that when applied to a high-efficiency cutting process (such as a cutting process involving a large feeding rate), it is required to attain further improvement in performance (such as breakage resistance and detachment resistance).

The present disclosure has been made in view of the above-described circumstance, and has an object to provide a cutting tool having excellent detachment resistance.

Advantageous Effect of the Present Disclosure

According to the above description, there can be provided a cutting tool having excellent detachment resistance.

Description of Embodiments

First, embodiments of the present disclosure are listed and described.

[1] A cutting tool according to the present disclosure includes: a substrate; and a coating film provided on the substrate, wherein
   the coating film includes a multilayer structure layer having one or more first unit layers and one or more second unit layers,
   in the multilayer structure layer, the one or more first unit layers and the one or more second unit layers are alternately layered,
   when X-ray diffraction intensities of a (200) plane, a (111) plane, and a (220) plane in the multilayer structure layer are respectively represented by $I_{(200)}$, $I_{(111)}$, and $I_{(220)}$, the following formula 1 is satisfied:

$0.6 \leq I_{(200)}/\{I_{(200)}+I_{(111)}+I_{(220)}\}$     Formula 1, each of the one or more first unit layers has a NaCl-like structure in which an interplanar spacing $d_{1c}$ in a c-axis direction is larger than an interplanar spacing $d_{1a}$ in an a-axis direction,
   each of the one or more second unit layers has a NaCl-like structure in which an interplanar spacing $d_{2c}$ in the c-axis direction is smaller than an interplanar spacing $d_{2a}$ in the a-axis direction,
   the following formulas 2, 3 and 4 are satisfied:

$1 \leq d_{1a}/d_{2a} \leq 1.02$     Formula 2

$1.01 \leq d_{1c}/d_{2c} \leq 1.05$     Formula 3, and $d_{1a}/d_{2a} < d_{1c}/d_{2c}$     Formula 4, each of the interplanar spacings in the a-axis direction is a lattice spacing in a direction perpendicular to a layering direction of the one or more first unit layers and the one or more second unit layers, and
   each of the interplanar spacings in the c-axis direction is a lattice spacing in a direction parallel to the layering direction of the one or more first unit layers and the one or more second unit layers.

In the multilayer structure layer in the cutting tool, the interplanar spacing $d_{1a}$ in the a-axis direction in the first unit layer is substantially the same as the interplanar spacing $d_{2a}$ in the a-axis direction in the second unit layer (formula 2). Therefore, the crystal lattice in the first unit layer is matched with the crystal lattice in the second unit layer in the in-plane direction (direction perpendicular to the layering direction) (see FIG. 6), thereby attaining excellent adhesion between the first unit layer and the second unit layer. That is, since the cutting tool includes the above-described configuration, the cutting tool can have excellent detachment resistance. The "detachment resistance" refers to resistance against detachment at the interface between the first unit layer and the second unit layer.

[2] A thickness of each of the one or more first unit layers is more than or equal to 5 nm and less than or equal to 50 nm. By defining in this way, the cutting tool can have further excellent detachment resistance.

[3] A thickness of each of the one or more second unit layers is more than or equal to 5 nm and less than or equal to 50 nm. By defining in this way, the cutting tool can have further excellent detachment resistance.

[4] A thickness of the multilayer structure layer is more than or equal to 10 nm and less than or equal to 10 μm. By defining in this way, the cutting tool can have excellent detachment resistance and excellent wear resistance.

[5] Each of the one or more first unit layers is composed of a compound including at least one first element and at least one second element as constituent elements, the at least one first element being selected from a group consisting of titanium, aluminum, chromium, silicon, niobium, tungsten, vanadium, tantalum, hafnium, zirconium, and molybdenum, the at least one second element being selected from a group consisting of boron, carbon, nitrogen, and oxygen. By defining in this way, the cutting tool can have excellent detachment resistance and excellent wear resistance.

[6] Each of the one or more second unit layers is composed of a compound including at least one third element and at least one fourth element as constituent elements, the at least one third element being selected from a group consisting of titanium, aluminum, chromium, silicon, niobium, tungsten, vanadium, tantalum, hafnium, zirconium, and molybdenum, the at least one fourth element being selected from a group consisting of boron, carbon, nitrogen, and oxygen, and
   a composition of each of the one or more second unit layers is different from a composition of each of the one or more first unit layers. By defining in this way, the cutting tool can have excellent detachment resistance and excellent boundary wear resistance.

Details of Embodiments of the Present Disclosure

The following describes one embodiment (hereinafter, referred to as "the present embodiment") of the present disclosure. However, the present embodiment is not limited thereto. In the present specification, the expression "A to Z" represents a range of lower to upper limits (i.e., more than or equal to A and less than or equal to Z). When no unit is indicated for A and a unit is indicated only for Z, the unit of A is the same as the unit of Z. Further, in the present specification, when a compound is expressed by a chemical formula in which a composition ratio of composition elements is not limited such as "TiC", it is assumed that the chemical formula includes all the conventionally known composition ratios (element ratios). In this case, it is assumed that the above-described chemical formula includes not only a stoichiometric composition but also a non-stoichiometric composition. For example, the chemical formula "TiC" includes not only a stoichiometric composition "$Ti_1C_1$" but also a non-stoichiometric composition such as "$Ti_1C_{0.8}$". The same also applies to compounds other than the "TiC".

<<Cutting Tool>>

A cutting tool according to the present disclosure includes: a substrate; and a coating film provided on the substrate, wherein the coating film includes a multilayer structure layer having one or more first unit layers and one or more second unit layers, in the multilayer structure layer, the one or more first unit layers and the one or more second unit layers are alternately layered, when X-ray diffraction intensities of a (200) plane, a (111) plane, and a (220) plane in the multilayer structure layer are respectively represented by $I_{(200)}$, $I_{(111)}$, and $I_{(200)}$, the following formula 1 is satisfied:

$$0.6 \le I_{(200)}/\{I_{(200)}+I_{(111)}+I_{(220)}\} \quad \text{Formula 1,}$$

each of the one or more first unit layers has a NaCl-like structure in which an interplanar spacing $d_{1c}$ in a c-axis direction is larger than an interplanar spacing $d_{1a}$ in an a-axis direction, each of the one or more second unit layers has a NaCl-like structure in which an interplanar spacing $d_{2c}$ in the c-axis direction is smaller than an interplanar spacing $d_{2a}$ in the a-axis direction, and the following formulas 2, 3 and 4 are satisfied:

$$1 \le d_{1a}/d_{2a} \le 1.02 \quad \text{Formula 2}$$

$$1.01 \le d_{1c}/d_{2c} \le 1.05 \quad \text{Formula 3, and}$$

$$d_{1a}/d_{2a} < d_{1c}/d_{2c} \quad \text{Formula 4,}$$

Here, each of the interplanar spacings in the a-axis direction is a lattice spacing in a direction perpendicular to a layering direction of the one or more first unit layers and the one or more second unit layers, and each of the interplanar spacings in the t-axis direction is a lattice spacing in a direction parallel to the layering direction of the one or more first unit layers and the one or more second unit layers.

Examples of the cutting tool according to the present embodiment include a drill, an end mill, an indexable cutting insert for drill, an indexable cutting insert for end mill, an indexable cutting insert for milling, an indexable cutting insert for turning, a metal saw, a gear cutting tool, a reamer, a tap, and the like.

Figure 1:
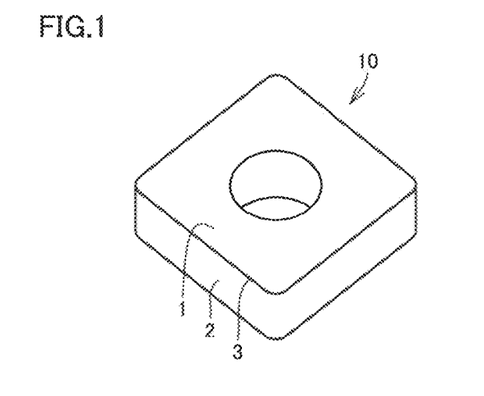
FIG. 1 is a perspective view illustrating one implementation of a cutting tool.

FIG. 1 is a perspective view illustrating one implementation of the cutting tool. The cutting tool having such a shape is used as an indexable cutting insert, for example. Such a cutting tool 10 has a rake face 1, a flank face 2, and a cutting edge ridgeline portion 3 at which rake face 1 and flank face 2 cross each other. That is, rake face 1 and flank face 2 are surfaces connected to each other with cutting edge ridgeline portion 3 being interposed therebetween. Cutting edge ridgeline portion 3 constitutes a cutting edge tip portion of cutting tool 10. It is also understandable that the shape of such a cutting tool 10 corresponds to the shape of the substrate of the cutting tool. That is, the substrate has the rake face, the flank face, and the cutting edge ridgeline portion that connects the rake face and the flank face to each other.

<Substrate>

For the substrate of the present embodiment, any conventionally known substrate for such a purpose of use can be used. For example, the substrate preferably includes one selected from a group consisting of: a cemented carbide (for example, a tungsten carbide (WC) based cemented carbide, a cemented carbide including Co in addition to WC, or a cemented carbide having a carbonitride of Cr, Ti, Ta, and Nb, or the like added therein in addition to WC); a cermet (including TiC, TiN, TiCN, or the like as a main component); a high-speed steel; a ceramic (titanium carbide, silicon carbide, silicon nitride, aluminum nitride, aluminum oxide, or the like); a cubic boron nitride sintered material (cBN sintered material); and a diamond sintered material.

Among these various types of substrates, it is preferable to select the cemented carbide (particularly, the WC-based cemented carbide) or to select the cermet (particularly, the TiCN-based cermet). This is due to the following reason: each of these substrates is excellent in balance between hardness and strength particularly at a high temperature, and has excellent characteristics as a substrate of a cutting tool for the above-described purpose of use.

When the cemented carbide is used as the substrate, the effects of the present embodiment are achieved even if the cemented carbide includes free carbon or an abnormal phase called η phase in the structure thereof. It should be noted that the substrate used in the present embodiment may have a modified surface. For example, in the case of the cemented carbide, a β-free layer may be formed on the surface. In the case of the cBN sintered material, a surface hardening layer may be formed. Even when the surface is thus modified, the effects of the present embodiment are exhibited.

When the cutting tool is an indexable cutting insert (such as an indexable cutting insert for turning or an indexable cutting insert for milling), a substrate having a chip breaker or a substrate having no chip breaker may be included. For the shape of the ridgeline portion of the cutting edge, any of the following shapes is included: a sharp edge (ridge at which the rake face and the flank face cross each other); a honing (shape obtained by providing a curvature to the sharp edge); a negative land (chamfered shape); and a shape obtained by combining the honing and the negative land.

<Coating Film>

The coating film according to the present embodiment is provided on the substrate. The "coating film" has a function of improving various characteristics in the cutting tool such as detachment resistance, breakage resistance, wear resistance, and the like by coating at least a portion (for example, a portion of the rake face) of the substrate. The coating film preferably coats the entire surface of the substrate. However, a coating film that does not coat a portion of the substrate and a coating film having a partially different configuration are not deviated from the scope of the present embodiment. The coating film includes a multilayer structure layer having one or more first unit layer and one or more second unit layer.

The thickness of the coating film is preferably more than or equal to 10 nm and less than or equal to 10 μm, is more preferably more than or equal to 10 nm and less than or equal to 5 μm, and is further preferably more than or equal to 1 μm and less than or equal to 3 μm. Here, the thickness of the coating film refers to a total of the respective thicknesses of the layers included in the coating film. Examples of the "layers included in the coating film" include the above-described multilayer structure layer and other layers such as a below-described underlying layer, a below-described intermediate layer, and a below-described surface layer. The thickness of the coating film can be determined, for example, as follows: a transmission electron microscope (TEM) is used to measure thicknesses at ten arbitrary points in a cross section sample parallel to the normal direction of the surface of the substrate, and the average value of the measured thicknesses at the ten points is determined. A measurement magnification on this occasion is 10000×, for example. Examples of the cross sectional sample includes a sample obtained by slicing the cross section of the cutting tool using an ion slicer apparatus. The same applies to the measurement of each of the respective thicknesses of the multilayer structure layer, the underlying layer, the intermediate layer, and the surface layer. Examples of the transmission electron microscope include JEM-2100F (trademark) provided by JEOL.

(Multilayer Structure Layer)

Figure 2:
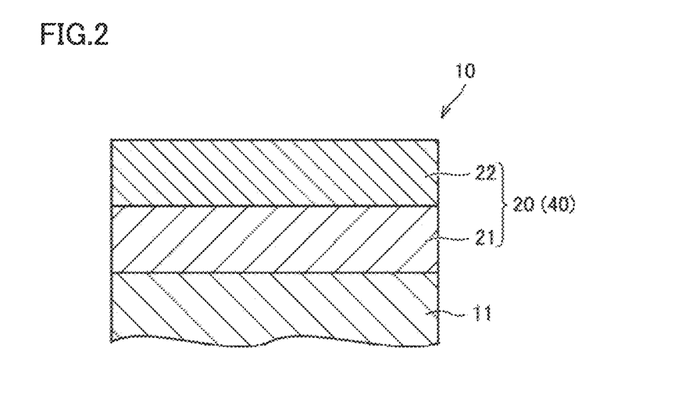
FIG. 2 is a schematic cross sectional view of a cutting tool according to one implementation of the present embodiment.
Figure 3:
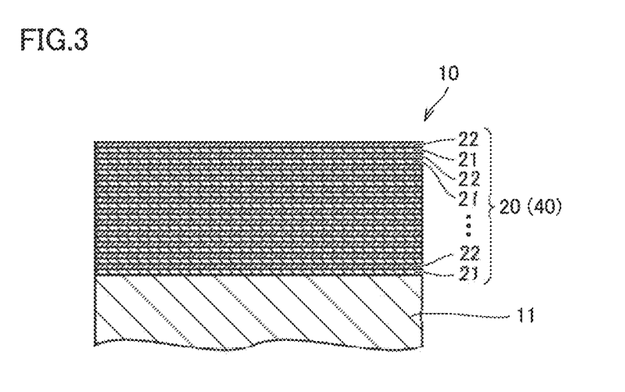
FIG. 3 is a schematic cross sectional view of a cutting tool according to another implementation of the present embodiment.
Figure 4:
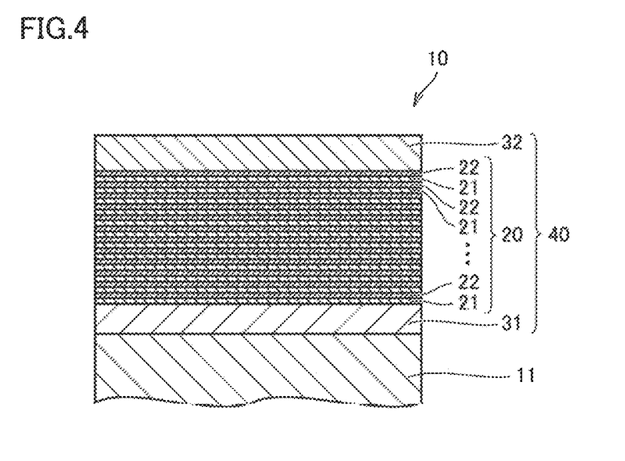
FIG. 4 is a schematic cross sectional view of a cutting tool according to still another implementation of the present embodiment.

A multilayer structure layer 20 according to the present embodiment includes a first unit layer 21 and a second unit layer 22 (FIG. 2). In multilayer structure layer 20, one or more first unit layers 21 and one or more second unit layers 22 are alternately layered (FIGS. 2, 3, and 4). Multilayer structure layer 20 may be provided directly on substrate 11 (FIGS. 2 and 3) or may be provided on substrate 11 with another layer such as an underlying layer 31 being interposed therebetween (FIG. 4) as long as the effects exhibited by the cutting tool according to the present embodiment are maintained. Another layer such as a surface layer 32 may be provided on multilayer structure layer 20 (FIG. 4) as long as the effects exhibited by the cutting tool are maintained.

Multilayer structure layer 20 may be provided at a surface of coating film 40.

In one aspect of the present embodiment, a plurality of the multilayer structure layers may be provided as long as the effects exhibited by the cutting tool are maintained. For example, when the coating film includes a first multilayer structure layer and a second multilayer structure layer, the coating film may further include an intermediate layer provided between the first multilayer structure layer and the second multilayer structure layer.

The multilayer structure layer preferably coats the flank face of the substrate. The multilayer structure layer may coat the rake face of the substrate. The multilayer structure layer more preferably coats a whole of the surface of the substrate.

However, a multilayer structure layer that does not coat a portion of the substrate is not deviated from the scope of the present embodiment.

The thickness of the multilayer structure layer is preferably more than or equal to 10 nm and less than or equal to 10 μm, is more preferably more than or equal to 1 μm and less than or equal to 5 μm, and is further preferably more than or equal to 1 μm and less than or equal to 3 μm. In this way, the cutting tool can have excellent detachment resistance and excellent wear resistance. The thickness can be measured, for example, by observing the above-described cross section of the cutting tool at a magnification of 10000× using a transmission electron microscope.

When X-ray diffraction intensities of a (200) plane, a (111) plane, and a (220) plane in the multilayer structure layer are respectively represented by $I_{(200)}$, $I_{(111)}$, and $I_{(220)}$, the following formula 1 is satisfied:

$$0.6 \leq I_{(200)}/\{I_{(200)}+I_{(111)}+I_{(220)}\} \quad \text{Formula 1,}$$

Here, the "X-ray diffraction intensity $I_{(200)}$ of the (200) plane" refers to a diffraction intensity at the highest peak (height of the peak) among X-ray diffraction peaks originating from the (200) plane. The same applies to the "X-ray diffraction intensity $I_{(111)}$ of the (111) plane" and the "X-ray diffraction intensity $I_{(220)}$ of the (220) plane".

Specifically, X-ray diffraction measurement (XRD measurement) is performed in accordance with a θ/2θ method onto each of arbitrary three points in the multilayer structure layer under conditions described in below-described Examples so as to find X-ray diffraction intensities of a predetermined crystal plane at the three points, and the average value of the found X-ray diffraction intensities at the three points is defined as the X-ray diffraction intensity of the predetermined crystal plane. On this occasion, the X-ray diffraction intensity of the (200) plane corresponds to an X-ray diffraction intensity in the vicinity of 2θ=43 to 44°, and the X-ray diffraction intensity of the (111) plane corresponds to an X-ray diffraction intensity in the vicinity of 2θ=37 to 38°. Moreover, the X-ray diffraction intensity of the (220) plane corresponds to an X-ray diffraction intensity in the vicinity of 2θ=63 to 65°.

Examples of the apparatus used for the X-ray diffraction measurement include "SmartLab" (trademark) provided by Rigaku; "X'pert" (trademark) provided by PANalytical; and the like.

The upper limit of $I_{(200)}/\{I_{(111)}+I_{(220)}\}$ may be, for example, less than or equal to 1, less than 1, less than or equal to 0.95, or less than or equal to 0.8.

In one aspect of the present embodiment, the residual stress of the multilayer structure layer may be more than or equal to −3 GPa and less than or equal to 0 GPa. Here, the "residual stress of the multilayer structure layer" refers to an internal stress (inherent strain) present in the multilayer structure layer. A residual stress represented by a negative value (value with a minus sign) in the residual stresses of the multilayer structure layer is referred to as "compressive residual stress". That is, in one aspect of the present embodiment, the compressive residual stress of the multilayer structure layer may be more than or equal to 0 GPa and less than or equal to 3 GPa. As will be described later, in the multilayer structure layer (that is, the first unit layer and the second unit layer) in the present embodiment, generation of compressive residual stress in the layering direction is suppressed. Therefore, the compressive residual stress of the multilayer structure layer can fall within the above-described range. The residual stress can be found by a 2θ-$\sin^2\psi$ method (side inclination method) using X-rays.

The present inventors consider that in the case where the residual stress of the multilayer structure layer is more than or equal to −3 GPa and less than or equal to 0 GPa, an interplanar spacing ($d_{1c}$, $d_{2c}$) in the c-axis direction has a value close to an interplanar spacing ($d_1$, $d_2$) of a NaCl structure when a single layer is formed. The present inventors consider that when the interplanar spacing in the c-axis direction has such a value, intrinsic properties (for example, hardness, toughness, strength, and the like) of each of the first unit layer and the second unit layer are exhibited.

(First Unit Layer)

In the present embodiment, the first unit layer has a NaCl-like structure in which interplanar spacing $d_{1c}$ in the c-axis direction is larger than interplanar spacing $d_{1a}$ in the a-axis direction. Here, the "NaCl-like structure" refers to a sodium chloride type crystal structure in which the interplanar spacing in the a-axis direction and the interplanar spacing in the c-axis direction are different from each other. In the present embodiment, the "interplanar spacing in the a-axis direction" refers to a lattice spacing in a direction perpendicular to the layering direction of the first unit layer and the below-described second unit layer. In the present embodiment, the "interplanar spacing in the c-axis direction" refers to a lattice spacing in a direction parallel to the layering direction of the first unit layer and the below-described second unit layer.

In the present embodiment, in the case where a single layer is formed using the compound of which the first unit layer is composed and a single layer is formed using the compound of which the second unit layer is composed, one having a larger interplanar spacing of the NaCl structure is defined as the "first unit layer". That is, interplanar spacing $d_1$ (nm) of the NaCl structure in the case where the single layer is formed using the compound of which the first unit layer is composed is larger than interplanar spacing $d_2$ (nm) of the NaCl structure in the case where the single layer is formed using the compound of which the second unit layer is composed.

A ratio $d_{1c}/d_{1a}$, of interplanar spacing $d_{1c}$ (nm) in the c-axis direction to interplanar spacing $d_{1a}$ (nm) in the a-axis direction in the first unit layer is preferably more than 1 and less than or equal to 1.05, and is more preferably more than or equal to 1.01 and less than or equal to 1.03.

Each of the interplanar spacings is found as follows. First, a measurement specimen is produced to include a cross section parallel to the normal direction of the surface of the substrate. Next, a layer to be observed (for example, the first unit layer or the second unit layer) in the cross section is observed using a scanning transmission electron microscope (STEM), and the observed image is subjected to Fourier transform, thus performing the measurement. In the present embodiment, the analysis in the STEM is performed under the following conditions.

<Analysis Conditions in STEM>
Measurement apparatus: trademark "JEM-2100f (Cs)" provided by JEOL
Acceleration voltage: 200 kV
Magnification: 200000× to 8000000×
Beam diameter: 0.13 μm The thickness of each of the one or more first unit layers is preferably more than or equal to 5 nm and less than or equal to 50 nm, is more preferably more than or equal to 10 nm and less than or equal to 30 nm, and is further preferably more than or equal to 10 nm and less than or equal to 20 nm. The thickness can be measured, for example, by observing the cross section of the cutting tool at a magnification of 10000× using a transmission electron microscope.

The first unit layer is preferably composed of a compound including at least one first element and at least one second element as constituent elements, the at least one first element being selected from a group consisting of titanium (Ti), aluminum (Al), chromium (Cr), silicon (Si), niobium (Nb), tungsten (W), vanadium (V), tantalum (Ta), hafnium (Hf), zirconium (Zr), and molybdenum (Mo), the at least one second element being selected from a group consisting of boron (B), carbon (C), nitrogen (N), and oxygen (O). The composition of the first unit layer can be found by performing an elemental analysis onto the whole of the first unit layer in the cross sectional sample by energy dispersive X-ray spectroscopy (TEM-EDX) accompanied with the TEM. An observation magnification on this occasion is 20000×, for example.

Examples of the compound of the first unit layer include TiAlN, TiAlSiN, TiAlNbN, and the like.

(Second Unit Layer)

In the present embodiment, the second unit layer has a NaCl-like structure in which interplanar spacing $d_{2c}$ (nm) in the c-axis direction is smaller than interplanar spacing $d_{2a}$ (nm) in the a-axis direction.

A ratio $d_{2c}/d_{2a}$ of interplanar spacing $d_{2c}$ in the c-axis direction to interplanar spacing $d_{2a}$ in the a-axis direction in the second unit layer is preferably more than or equal to 0.95 and less than 1, and is more preferably more than or equal to 0.96 and less than or equal to 0.995.

The thickness of each of the one or more second unit layers is preferably more than or equal to 5 nm and less than or equal to 50 nm, and is more preferably more than or equal to 10 nm and less than or equal to 20 nm. The thickness can be measured, for example, by observing the above-described cross section of the cutting tool at a magnification of 10000× using a transmission electron microscope.

The second unit layer is preferably composed of a compound including at least one third element and at least one fourth element as constituent elements, the at least one third element being selected from a group consisting of titanium, aluminum, chromium, silicon, niobium, tungsten, vanadium, tantalum, hafnium, zirconium, and molybdenum, the at least one fourth element being selected from a group consisting of boron, carbon, nitrogen, and oxygen. Here, the composition of the second unit layer is different from the composition of the first unit layer. The composition of the second unit layer can be found by performing an elemental analysis onto a whole of the second unit layer in the cross sectional sample by energy dispersive X-ray spectroscopy (TEM-EDX) accompanied with the TEM. An observation magnification on this occasion is 20000×, for example.

Examples of the compound of the second unit layer include AlCrN, AlCrSiN, AlCrNbN, and AlCrBN.

(Interplanar Spacing of First Unit Layer and Interplanar Spacing of Second Unit Layer)

In the present embodiment, interplanar spacing $d_{1a}$ in the a-axis direction in the first unit layer and interplanar spacing $d_{2a}$ in the a-axis direction in the second unit layer satisfy the following formula (2):

$$1 \leq d_{1a}/d_{2a} \leq 1.02 \qquad \text{Formula 2.}$$

Figure 6:
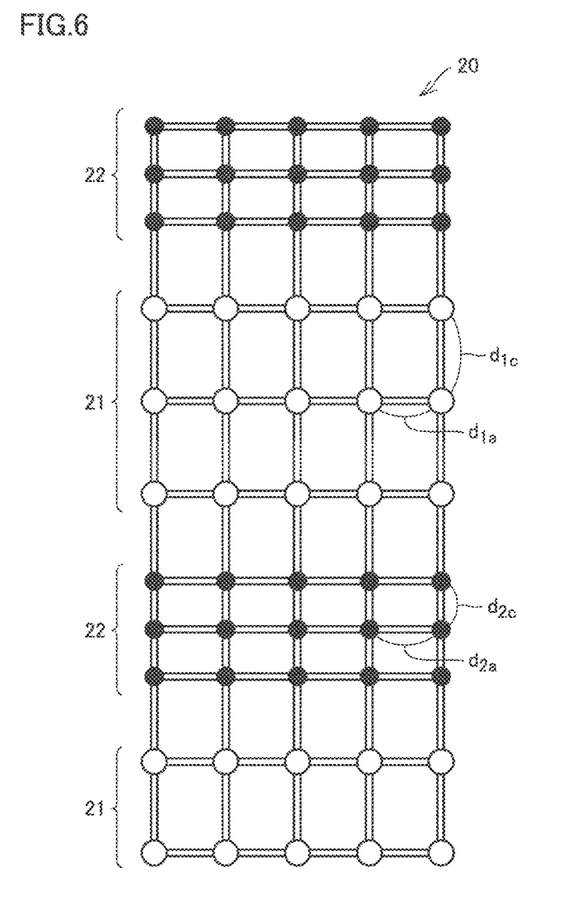
FIG. 6 is a schematic cross sectional view illustrating a state of an interface between two layers in a multilayer structure layer of the present embodiment.

Since interplanar spacing $d_{1a}$ and interplanar spacing $d_{2a}$ satisfy formula 2, crystal lattices of the first unit layer and the second unit layer are matched with each other at an interface between the first unit layer and the second unit layer (see FIG. 6). Therefore, the strength of the interface between the first unit layer and the second unit layer is improved, thereby improving adhesion between the first unit layer and the second unit layer.

$d_{1a}/d_{2a}$ is preferably more than or equal to 1 and less than or equal to 1.01, and is more preferably more than or equal to 1 and less than or equal to 1.005.

In the present embodiment, interplanar spacing $d_{1c}$ in the c-axis direction in the first unit layer and interplanar spacing $d_{2c}$ in the c-axis direction in the second unit layer satisfy the following formula 3:

$$1.01 \leq d_{1c}/d_{2c} \leq 1.05 \qquad \text{Formula 3.}$$

Since interplanar spacing $d_{1c}$ and interplanar spacing $d_{2c}$ satisfy formula 3, the cutting tool has excellent detachment resistance.

$d_{1c}/d_{2c}$ is preferably more than or equal to 1.02 and less than or equal to 1.05, and is more preferably more than or equal to 1.03 and less than or equal to 1.05.

In the present embodiment, $d_{1a}/d_{2a}$ and $d_{1c}/d_{2c}$ satisfy the following formula 4:

$$d_{1a}/d_{2a} < d_{1c}/d_{2c} \qquad \text{Formula 4.}$$

As described above, the interplanar spacings ($d_{1a}$, $d_{2a}$) of the first unit layer and the second unit layer of the multilayer structure layer in the in-plane direction (a-axis direction) are matched with each other. On the other hand, as compared with the interplanar spacings in the in-plane direction, the interplanar spacings ($d_{1c}$, $d_{2c}$) of the first unit layer and the second unit layer in the layering direction (c-axis direction) are close to the interplanar spacings ($d_1$, $d_2$) of the NaCl structure when a layer constituted only of a single first unit layer and layer constituted only of a single second unit layer are formed. Therefore, the present inventors consider that adhesion between the first unit layer and the second unit layer can be improved without compromising the intrinsic properties (for example, hardness, toughness, strength, and the like) of each of the first unit layer and the second unit layer.

For example, when the first unit layer is composed of TiAlN and the second unit layer is composed of AlCrN, the multilayer structure layer can have excellent wear resistance and can attain favorable roughness of a surface processed during cutting.

(Other Layer(s))

The coating film may further include other layer(s) as long as the effects of the present embodiment are not compromised. Examples of the other layer(s) include: the underlying layer provided between the substrate and the multilayer structure layer; the surface layer provided on the multilayer structure layer; and the like. Also, examples of the other layer(s) include the intermediate layer provided between the first multilayer structure layer and the second multilayer structure layer in the case where the coating film includes the first multilayer structure layer and the second multilayer structure layer.

The underlying layer may be, for example, a layer composed of a compound represented by AlCrN. The surface layer may be, for example, a layer composed of a compound represented by TiN. The intermediate layer may be, for example, a layer composed of a compound represented by TiAlN. The composition of each of the other layer(s) can be found by performing an elemental analysis onto the whole of each of the other layer(s) in the cross sectional sample by energy dispersive X-ray spectroscopy (TEM-EDX) accompanied with the TEM. An observation magnification on this occasion is 20000×, for example.

The thickness of each of the other layer(s) is not particularly limited as long as the effects of the present embodiment are not compromised, and may be, for example, more than or equal to 0.1 μm and less than or equal to 2 μm. The thickness can be measured, for example, by observing the above-described cross section of the cutting tool at a magnification of 10000× using a transmission electron microscope.

<<Method of Manufacturing Cutting Tool>>

A method of manufacturing a cutting tool according to the present embodiment includes:

a step of preparing the substrate (hereinafter, also referred to as "first step"); and a step of forming the multilayer structure layer by alternately layering one or more first unit layers and one or more second unit layers on the substrate using a physical vapor deposition method (hereinafter, also referred to as "second step").

The physical vapor deposition method is a deposition method in which a source material (also referred to as "evaporation source" or "target") is vaporized using physical action, and the vaporized source material is adhered onto the substrate or the like. Examples of the physical vapor deposition method include a sputtering method, an arc ion plating method, and the like. Particularly, as the physical vapor deposition method used in the present embodiment, it is preferable to use the arc ion plating method.

In the arc ion plating method, after disposing the substrate in an apparatus and disposing the target as a cathode, high current is applied to this target to cause arc discharge. Accordingly, the target is evaporated to ionize the atoms thereof to deposit them on the substrate fed with negative bias voltage, thereby forming the coating film.

<First Step: Step of Preparing Substrate>

In the first step, the substrate is prepared. For example, a cemented carbide substrate or cubic boron nitride sintered material is prepared as the substrate. For each of the cemented carbide substrate and the cubic boron nitride sintered material, a commercially available substrate may be used or a substrate may be produced using a general powder metallurgy method. For example, when producing a cemented carbide using the general powder metallurgy method, a WC powder, a Co powder, and the like are first mixed using a ball mill or the like to obtain a powder mixture. This powder mixture is dried and then is shaped into a predetermined shape, thereby obtaining a shaped material. Further, by sintering the shaped material, a WC-Co based cemented carbide (sintered material) is obtained. Next, the sintered material is subjected to a predetermined cutting edge process such as honing, thereby producing a substrate composed of the WC-Co based cemented carbide. In the first step, any conventionally known substrate of this type other than the above-described substrate can be prepared.

<Second Step: Step of Forming Multilayer Structure Layer>

In the second step, the one or more first unit layers and the one or more second unit layers are alternately layered on the substrate using the physical vapor deposition method, thereby forming the multilayer structure layer. In order to achieve this, various types of methods are used in accordance with the composition of the multilayer structure layer to be formed. Examples of the methods include: a method employing an alloy target having different sizes of particles such as Ti, Cr, and Al; a method employing a plurality of targets having different compositions; a method in which pulse voltage is employed for the bias voltage to be applied during film formation; a method in which a gas flow rate is changed during film formation; a method in which the rotation speed of the substrate holder that holds the substrate is adjusted in the film formation apparatus; or the like.

For example, the second step can be performed as follows. First, a chip having any shape is mounted as the substrate in a chamber of the film formation apparatus. For example, the substrate is attached to an outer surface of the substrate holder on a rotation table rotatably provided at the center of the chamber of the film formation apparatus. Next, the evaporation source for forming the first unit layer and the evaporation source for forming the second unit layer are placed to face each other so as to sandwich the substrate holder. A bias power supply is attached to the substrate holder. Respective arc power supplies are attached to the evaporation source for forming the first unit layer and the evaporation source for forming the second unit layer. Nitrogen gas or the like is introduced as a reaction gas with the substrate being rotated at the center of the chamber. Further, an arc current of 80 to 100 A is alternately supplied to the evaporation source for forming the first unit layer and the evaporation source for forming the second unit layer while maintaining the substrate at a temperature of 400 to 500° C., maintaining a reaction gas pressure at 2 to 10 Pa, and maintaining the voltage of the bias power supply in a range of 20 to 50 V (DC power supply). Thus, metal ions are generated from the evaporation source for forming the first unit layer and the evaporation source for forming the second unit layer, the first unit layer is formed when the substrate faces the evaporation source for forming the first unit layer, and the second unit layer is formed when the substrate faces the evaporation source for forming the second unit layer. When a predetermined time has elapsed, the supply of the arc current is halted, thereby forming the multilayer structure layer (the first unit layer and the second unit layer) on the surface of the substrate. On this occasion, the thickness of each of the first unit layer and the second unit layer is adjusted by adjusting the rotation speed of the substrate. Further, the thickness of the multilayer structure layer is adjusted to fall within a predetermined range by adjusting the film formation time. In the second step, the multilayer structure layer may be formed on not only a portion relevant to the cutting process (for example, the rake face in the vicinity of the cutting edge) but also the surface of the substrate other than the portion relevant to the cutting process. In the manufacturing method according to the present embodiment, the arc current is alternately supplied to the evaporation source for forming the first unit layer and the evaporation source for forming the second unit layer at a temperature lower than that in a conventional method. Thus, film formation can be performed with the interplanar spacings being different in the layering direction while maintaining the matching of the interplanar spacings in the in-plane direction.

(Source Material of First Unit Layer)

In the second step, a source material of the first unit layer preferably includes at least one first element selected from a group consisting of titanium, aluminum, chromium, silicon, niobium, tungsten, vanadium, tantalum, hafnium, zirconium, and molybdenum. The blended composition of the source material of the first unit layer can be appropriately adjusted in accordance with the composition of the first unit layer to be formed. The source material of the first unit layer may be in the form of a powder or flat plate.

(Source Material of Second Unit Layer)

In the second step, the source material of the second unit layer preferably includes at least one third element selected from a group consisting of titanium, aluminum, chromium, silicon, niobium, tungsten, vanadium, tantalum, hafnium, zirconium, and molybdenum. The blended composition of the source material of the second unit layer can be appropriately adjusted in accordance with the composition of the second unit layer to be formed. The blended composition of the source material of the second unit layer is preferably different from the blended composition of the source material of the first unit layer. The source material of the second unit layer may be in the form of a powder or flat plate.

In the present embodiment, the above-described reaction gas is appropriately set in accordance with the composition of the multilayer structure layer. Examples of the reaction gas include nitrogen gas, methane gas, and the like.

<Other Step(s)>

In the manufacturing method according to the present embodiment, step(s) other than the above-described steps may be also appropriately performed between the first step and the second step, such as: a step of performing ion bombardment treatment onto the surface of the substrate; a step of forming the underlying layer between the substrate and the multilayer structure layer; a step of forming the surface layer on the multilayer structure layer; a step of forming the intermediate layer between the first multilayer structure layer and the second multilayer structure layer; a step of performing surface treatment; and the like.

When forming the other layers such as the underlying layer, the intermediate layer, and the surface layer, the other layers may be formed by conventional methods.

EXAMPLES

Hereinafter, the present invention will be described in detail with reference to Examples, but the present invention is not limited thereto.

<<Production of Cutting Tool>>

<Preparation of Substrate>

A cubic boron nitride sintered material (cBN sintered material) was prepared in the following procedure (first step: the step of preparing the substrate) as a substrate on which a coating film was to be formed. First, a source material powder of cBN and a source material powder of a binder were uniformly mixed, and the mixture was then introduced into a Mo (molybdenum) capsule and shaped into a predetermined shape, thereby obtaining a shaped material. Next, the obtained shaped material was held at a temperature of 1300 to 1800° C. at a pressure of 5 to 7 GPa for 10 to 60 minutes, thereby obtaining a cBN sintered material. The obtained sintered material was brazed to a substrate composed of a cemented carbide and was shaped into a predetermined shape (ISO standard: DNGA150408). In this way, a substrate having a cutting edge portion composed of the composite sintered material was prepared.

<Ion Bombardment Treatment>

Prior to production of the below-described coating film, ion bombardment treatment was performed onto a surface of the substrate in the following procedure. First, the substrate was set in an arc ion plating apparatus. Next, ion bombardment treatment was performed under the following conditions.

Gas composition: Ar (100%)
Gas pressure: 0.5 Pa
Bias voltage: 600 V (DC power supply)
Treatment time: 60 minutes <Production of Coating Film>

The coating film was produced by forming a multilayer structure layer shown in Table 1 on the surface of the substrate having been through the ion bombardment treatment. It should be noted that in a below-described specimen No. 3, an underlying layer was formed on the surface of the substrate by a known physical vapor deposition method before forming the multilayer structure layer. Hereinafter, a method of producing the multilayer structure layer will be described.

(Production of Multilayer Structure Layer)

In each of specimens No. 1 to No. 7, nitrogen gas was introduced as a reaction gas with the substrate being rotated at the center of the chamber. Further, an arc current of 150 A was alternately supplied to each of the evaporation source for forming the first unit layer and the evaporation source for the second unit layer while maintaining the substrate at a temperature of 500° C., maintaining the reaction gas pressure at 4 Pa, and maintaining the voltage of the bias power supply at 35 V (DC power supply). Thus, metal ions were generated from the evaporation source for forming the first unit layer and the evaporation source for forming the second unit layer, with the result that the multilayer structure layer having the composition shown in Table 1 was formed on the substrate (second step: the step of forming the multilayer structure layer).

By the above-described steps, each of cutting tools of specimens No. 1 to No. 7 was produced.

TABLE 1

| | Multilayer Structure Layer | | | | | | | | | |
|---|---|---|---|---|---|---|---|---|---|---|
| | First Unit Layers | | Second Unit Layers | | | | | | | |
| Specimen No. | Composition | Thickness of Each Layer (nm) | Composition | Thickness of Each Layer (nm) | Number of Repetitions | Total Thickness (nm) | $I_{(200)}$ | $I_{(111)}$ | $I_{(220)}$ | $I_{(200)}/I_{(200)} + I_{(111)} + I_{(220)}$ |
| 1 | TiAlN | 30 | AlCrN | 15 | 65 | 2925 | 2085 | 487 | 689 | 0.639 |
| 2 | TiAlSiN | 30 | AlCrBN | 15 | 65 | 2925 | 1966 | 357 | 260 | 0.761 |
| 3* | TiAlN | 30 | AlCrN | 15 | 60 | 2700 | 2430 | 531 | 708 | 0.662 |
| 4 | TiAlN | 100 | AlCrN | 100 | 15 | 3000 | 2277 | 502 | 632 | 0.668 |
| 5 | TiAlN | 3 | AlCrN | 1.5 | 650 | 2925 | 2186 | 420 | 399 | 0.727 |
| 6 | TiAlN | 30 | AlCrN | 15 | 65 | 2925 | 1257 | 557 | 1673 | 0.36 |
| 7 | TiAlSiN | 3 | AlCrN | 1.5 | 650 | 2925 | 2282 | 460 | 417 | 0.722 |

*In specimen No. 3, an underlying layer (AlCrN) having a thickness of 200 nm was provided between the substrate and the multilayer structure layer.

<<Evaluations on Characteristics of Cutting Tool>>

Each of the cutting tools of specimens No. 1 to No. 7 produced as described above was used to evaluate the characteristics of the cutting tool as follows. It should be noted that each of the cutting tools of specimens No. 1 to No. 3 corresponds to an example of the present disclosure, and each of the cutting tools of specimens No. 4 to No. 7 corresponds to a comparative example.

<Measurement of Thickness of Coating Film (Thickness of Multilayer Structure Layer)>

The thickness of the coating film (the thickness of the first unit layer, the thickness of the second unit layer, the thickness of the multilayer structure layer, the thickness of the underlying layer, and the like) was found by using a transmission electron microscope (TEM) (trademark: JEM-2100F provided by JEOL) to measure thicknesses at arbitrary ten points in a cross section sample parallel to the normal direction of the surface of the substrate and by calculating the average value of the measured thicknesses at the ten points. An observation magnification on this occasion was 10000×. Further, the number of repetitions of the first unit layers and the second unit layers in the multilayer structure layer was found in accordance with the following formula. Results are shown in Table 1. (The number of repetitions of the first unit layers and the second unit layers)=the total thickness of the multilayer structure layer/ (the thickness of each of the first unit layers+the thickness of each of the second unit layers)

<X-Ray Diffraction Analysis of Multilayer Structure Layer>

The multilayer structure layer was analyzed by an X-ray diffraction analysis method (XDR analysis method) to find the X-ray diffraction intensities of the (200) plane, the (111) plane, and the (220) plane. Conditions for the X-ray diffraction analysis are described as follows. The found X-ray diffraction intensities $I_{(200)}$, $I_{(111)}$, $I_{(220)}$, as well as $I_{(200)}/\{I_{(200)}+I_{(111)}+I_{(220)}\}$ are shown in Table 1.

Conditions of X-Ray Diffraction Analysis
  Scanning axis: 2θ-θ
  X-ray source: Cu-Kα ray (1.541862 Å)
  Detector: 0-dimensional detector (scintillation counter)
  Tube voltage: 45 kV
  Tube Current: 40 mA
  Incident light optical system: use of mirror
  Light receiving optical system: use of analyzer crystal (PW3098/27)
  Step: 0.03°
  Integration time: 2 seconds
  Scanning range (2θ): 10° to 120°

<Analysis of First Unit Layer and Second Unit Layer by STEM>

Each of the first unit layers and the second unit layers was analyzed by a STEM in the following procedure. Each of the first unit layer and the second unit layer in the above-described cross sectional sample was observed by the STEM, and the observed image was subjected to Fourier transformation, thereby finding the interplanar spacings $(d_{1a}, d_{2a})$ in the a-axis direction and the interplanar spacings $(d_{1c}, d_{2c})$ in the c-axis direction in the first unit layer and the second unit layer. The analysis in the STEM was performed under the following conditions. Results are shown in Table 2.

<Analysis Conditions in STEM>
  Measurement apparatus: trademark "JEM-2100f (Cs)" provided by JEOL
  Acceleration voltage: 200 kV
  Magnification: 200000× to 8000000×
  Beam diameter: 0.13 μm <<Cutting Test>>

The obtained cutting tool was used to perform a cutting process (cutting distance: 150 m) under the following cutting conditions. Thereafter, an optical microscope was used to observe whether or not detachment of the multilayer structure layer occurred. A cutting tool in which the detachment of the multilayer structure layer was not confirmed was evaluated to have excellent detachment resistance. Results are shown in Table 2.

(Cutting Conditions)
  Workpiece: high-hardness steel SUJ2 (HRC62) (diameter of 85 mm×length of 200 mm)
  Cutting rate: V=150 m/min.
  Feed: f=0.15 mm/rev.
  Depth of cut: ap=0.5 mm
  Wet Type/Dry Type: Wet Type

TABLE 2

| | Multilayer Structure Layer | | | | | | | | |
|---|---|---|---|---|---|---|---|---|---|
| | First Unit Layers | | | Second Unit Layers | | | | | Compressive | |
| Specimen No. | $d_{1a}$ (nm) | $d_{1c}$ (nm) | $d_{1c}/d_{1a}$ | $d_{2a}$ (nm) | $d_{2c}$ (nm) | $d_{2c}/d_{2a}$ | $d_{1a}/d_{2a}$ | $d_{1c}/d_{2c}$ | Residual Stress (GPa) | Result of Cutting Test |
| 1 | 2.11 | 2.16 | 1.024 | 2.11 | 2.09 | 0.991 | 1.000 | 1.033 | 1.2 | No Detachment |
| 2 | 2.13 | 2.18 | 1.023 | 2.12 | 2.11 | 0.995 | 1.005 | 1.033 | 1.7 | No Detachment |
| 3 | 2.11 | 2.16 | 1.024 | 2.11 | 2.09 | 0.991 | 1.000 | 1.033 | 1.5 | No Detachment |
| 4 | 2.16 | 2.16 | 1.000 | 2.10 | 2.10 | 1.000 | 1.029 | 1.029 | 1.3 | Detachment Occurred |
| 5 | 2.13 | 2.13 | 1.000 | 2.13 | 2.13 | 1.000 | 1.000 | 1.000 | 3.8 | Detachment Occurred |
| 6 | 2.11 | 2.16 | 1.024 | 2.11 | 2.09 | 0.991 | 1.000 | 1.033 | 2.4 | Detachment Occurred |
| 7 | 2.13 | 2.18 | 1.023 | 2.10 | 2.07 | 0.986 | 1.014 | 1.053 | 3.0 | Detachment Occurred |

<Results>

In view of the results shown in Tables 1 and 2, in the cutting test, the detachment of the multilayer structure layer was not confirmed in each of the cutting tools of specimens No. 1 to No. 3 each satisfying formulas 1 to 4. On the other hand, in the cutting test, the detachment of the multilayer structure layer was confirmed in each of the cutting tools of specimens No. 4 and No. 5 each not satisfying formulas 2 to 4, the cutting tool of specimen No. 6 not satisfying formula 1, and the cutting tool of specimen No. 7 not satisfying formula 3.

In view of the above results, it was understood that each of the cutting tools of specimens No. 1 to No. 3 according to the examples of the present disclosure is excellent in detachment resistance.

Heretofore, the embodiments and examples of the present invention have been illustrated, but it has been initially expected to appropriately combine configurations of the embodiments and examples.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

REFERENCE SIGNS LIST

1: rake face; 2: flank face; 3: cutting edge ridgeline portion; 10: cutting tool; 11: substrate; 20: multilayer structure layer; 21: first unit layer; 22: second unit layer; 31: underlying layer; 32: surface layer; 40: coating film.

The invention claimed is:

1. A cutting tool comprising: a substrate; and a coating film provided on the substrate, wherein
the coating film includes a multilayer structure layer having one or more first unit layers and one or more second unit layers,
in the multilayer structure layer, the one or more first unit layers and the one or more second unit layers are alternately layered,
when X-ray diffraction intensities of a (200) plane, a (111) plane, and a (220) plane in the multilayer structure layer are respectively represented by $I_{(200)}$, $I_{(111)}$, and $I_{(220)}$, the following formula 1 is satisfied:

$$0.6 \leq I_{(200)}/\{I_{(200)}+I_{(111)}+I_{(220)}\} \quad \text{Formula 1,}$$

each of the one or more first unit layers has a NaCl-like structure in which an interplanar spacing $d_{1c}$ in a c-axis direction is larger than an interplanar spacing $d_{1a}$ in an a-axis direction,
each of the one or more second unit layers has a NaCl-like structure in which an interplanar spacing $d_{2c}$ in the c-axis direction is smaller than an interplanar spacing $d_{2a}$ in the a-axis direction,
the following formulas 2, 3 and 4 are satisfied:

$$1 \leq d_{1a}/d_{2a} \leq 1.02 \quad \text{Formula 2,}$$

$$1.01 \leq d_{1c}/d_{2c} \leq 1.05 \quad \text{Formula 3, and}$$

$$d_{1a}/d_{2a} < d_{1c}/d_{2c} \quad \text{Formula 4,}$$

each of the interplanar spacings in the a-axis direction is a lattice spacing in a direction perpendicular to a layering direction of the one or more first unit layers and the one or more second unit layers, and
each of the interplanar spacings in the c-axis direction is a lattice spacing in a direction parallel to the layering direction of the one or more first unit layers and the one or more second unit layers.

2. The cutting tool according to claim 1, wherein a thickness of each of the one or more first unit layers is more than or equal to 5 nm and less than or equal to 50 nm.

3. The cutting tool according to claim 1, wherein a thickness of each of the one or more second unit layers is more than or equal to 5 nm and less than or equal to 50 nm.

4. The cutting tool according to claim 1, wherein a thickness of the multilayer structure layer is more than or equal to 10 nm and less than or equal to 10 μm.

5. The cutting tool according to claim 1, wherein each of the one or more first unit layers is composed of a compound including at least one first element and at least one second element as constituent elements, the at least one first element being selected from a group consisting of titanium, aluminum, chromium, silicon, niobium, tungsten, vanadium, tantalum, hafnium, zirconium, and molybdenum, the at least one second element being selected from a group consisting of boron, carbon, nitrogen, and oxygen.

6. The cutting tool according to claim 1, wherein
each of the one or more second unit layers is composed of a compound including at least one third element and at least one fourth element as constituent elements, the at least one third element being selected from a group consisting of titanium, aluminum, chromium, silicon, niobium, tungsten, vanadium, tantalum, hafnium, zirconium, and molybdenum, the at least one fourth element being selected from a group consisting of boron, carbon, nitrogen, and oxygen, and a composition of each of the one or more second unit layers is different from a composition of each of the one or more first unit layers.

7. The cutting tool according to claim 2, wherein a thickness of each of the one or more second unit layers is more than or equal to 5 nm and less than or equal to 50 nm.

8. The cutting tool according to claim 2, wherein a thickness of the multilayer structure layer is more than or equal to 10 nm and less than or equal to 10 μm.

9. The cutting tool according to claim 3, wherein a thickness of the multilayer structure layer is more than or equal to 10 nm and less than or equal to 10 μm.

10. The cutting tool according to claim 7, wherein a thickness of the multilayer structure layer is more than or equal to 10 nm and less than or equal to 10 μm.

11. The cutting tool according to claim 2, wherein each of the one or more first unit layers is composed of a compound including at least one first element and at least one second element as constituent elements, the at least one first element being selected from a group consisting of titanium, aluminum, chromium, silicon, niobium, tungsten, vanadium, tantalum, hafnium, zirconium, and molybdenum, the at least one second element being selected from a group consisting of boron, carbon, nitrogen, and oxygen.

12. The cutting tool according to claim 3, wherein each of the one or more first unit layers is composed of a compound including at least one first element and at least one second element as constituent elements, the at least one first element being selected from a group consisting of titanium, aluminum, chromium, silicon, niobium, tungsten, vanadium, tantalum, hafnium, zirconium, and molybdenum, the at least one second element being selected from a group consisting of boron, carbon, nitrogen, and oxygen.

13. The cutting tool according to claim 4, wherein each of the one or more first unit layers is composed of a compound including at least one first element and at least one second element as constituent elements, the at least one first element being selected from a group consisting of titanium, aluminum, chromium, silicon, niobium, tungsten, vanadium, tantalum, hafnium, zirconium, and molybdenum, the at least one second element being selected from a group consisting of boron, carbon, nitrogen, and oxygen.

14. The cutting tool according to claim 2, wherein
each of the one or more second unit layers is composed of
a compound including at least one third element and at least one fourth element as constituent elements, the at least one third element being selected from a group consisting of titanium, aluminum, chromium, silicon, niobium, tungsten, vanadium, tantalum, hafnium, zirconium, and molybdenum, the at least one fourth element being selected from a group consisting of boron, carbon, nitrogen, and oxygen, and
a composition of each of the one or more second unit layers is different from a composition of each of the one or more first unit layers.

15. The cutting tool according to claim 3, wherein
each of the one or more second unit layers is composed of
a compound including at least one third element and at least one fourth element as constituent elements, the at least one third element being selected from a group consisting of titanium, aluminum, chromium, silicon, niobium, tungsten, vanadium, tantalum, hafnium, zirconium, and molybdenum, the at least one fourth element being selected from a group consisting of boron, carbon, nitrogen, and oxygen, and
a composition of each of the one or more second unit layers is different from a composition of each of the one or more first unit layers.

16. The cutting tool according to claim 4, wherein
each of the one or more second unit layers is composed of
a compound including at least one third element and at least one fourth element as constituent elements, the at least one third element being selected from a group consisting of titanium, aluminum, chromium, silicon, niobium, tungsten, vanadium, tantalum, hafnium, zirconium, and molybdenum, the at least one fourth element being selected from a group consisting of boron, carbon, nitrogen, and oxygen, and
a composition of each of the one or more second unit layers is different from a composition of each of the one or more first unit layers.

17. The cutting tool according to claim 5, wherein
each of the one or more second unit layers is composed of
a compound including at least one third element and at least one fourth element as constituent elements, the at least one third element being selected from a group consisting of titanium, aluminum, chromium, silicon, niobium, tungsten, vanadium, tantalum, hafnium, zirconium, and molybdenum, the at least one fourth element being selected from a group consisting of boron, carbon, nitrogen, and oxygen, and
a composition of each of the one or more second unit layers is different from a composition of each of the one or more first unit layers.

18. The cutting tool according to claim 7, wherein
each of the one or more second unit layers is composed of
a compound including at least one third element and at least one fourth element as constituent elements, the at least one third element being selected from a group consisting of titanium, aluminum, chromium, silicon, niobium, tungsten, vanadium, tantalum, hafnium, zirconium, and molybdenum, the at least one fourth element being selected from a group consisting of boron, carbon, nitrogen, and oxygen, and
a composition of each of the one or more second unit layers is different from a composition of each of the one or more first unit layers.

19. The cutting tool according to claim 8, wherein
each of the one or more second unit layers is composed of
a compound including at least one third element and at least one fourth element as constituent elements, the at least one third element being selected from a group consisting of titanium, aluminum, chromium, silicon, niobium, tungsten, vanadium, tantalum, hafnium, zirconium, and molybdenum, the at least one fourth element being selected from a group consisting of boron, carbon, nitrogen, and oxygen, and
a composition of each of the one or more second unit layers is different from a composition of each of the one or more first unit layers.

* * * * *